United States Patent
Kushihara

(10) Patent No.: US 6,891,492 B1
(45) Date of Patent: May 10, 2005

(54) METHOD OF CONVERTING AN ANALOG SIGNAL INTO A DIGITAL SIGNAL

(75) Inventor: Hiroshi Kushihara, Nagano-ken (JP)

(73) Assignee: Tamagawa Seiki Kabushiki Kaisha, Nagano-ken (JP)

( * ) Notice: Subject to any disclaimer, the term of this patent is extended or adjusted under 35 U.S.C. 154(b) by 0 days.

(21) Appl. No.: 10/949,225

(22) Filed: Sep. 27, 2004

(30) Foreign Application Priority Data

Jul. 5, 2004 (JP) .................................... 2004-197873

(51) Int. Cl.$^7$ ........................................ H03M 1/12
(52) U.S. Cl. ................................ 341/155; 341/156
(58) Field of Search .............................. 341/155, 156, 341/118, 120

(56) References Cited

U.S. PATENT DOCUMENTS 6,278,388 B1 * 8/2001 Kushihara .................... 341/112
6,608,573 B2 * 8/2003 Kushihara .................... 341/116

* cited by examiner

Primary Examiner—Peguy Jeanpierre
Assistant Examiner—Joseph Lauture
(74) Attorney, Agent, or Firm—Wenderoth, Lind & Ponack, L.L.P.

(57) ABSTRACT

To enhance analog to digital conversion performance by obtaining a digital angle output using a negative feedback system including a resolver within a closed loop. The present invention provides a method of converting an analog signal into a digital signal, including inputting a two-phase sinusoidal signal an R/D conversion portion and converting an input rotational angle ($\theta$) into a digital angle output ($\Phi$), in which the method includes obtaining the digital angle output ($\Phi$) using a negative feedback control system including the resolver within a closed loop.

17 Claims, 2 Drawing Sheets

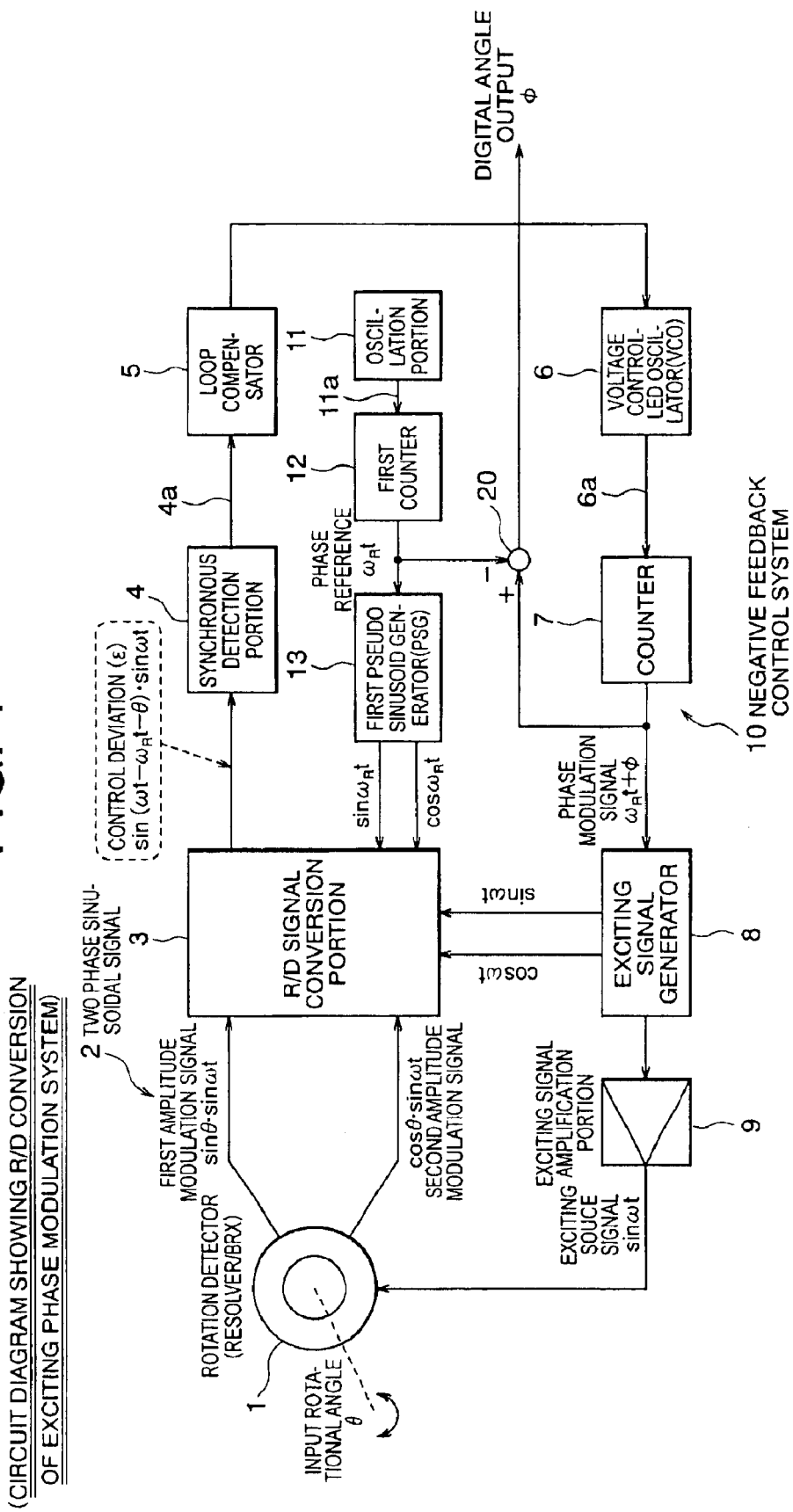

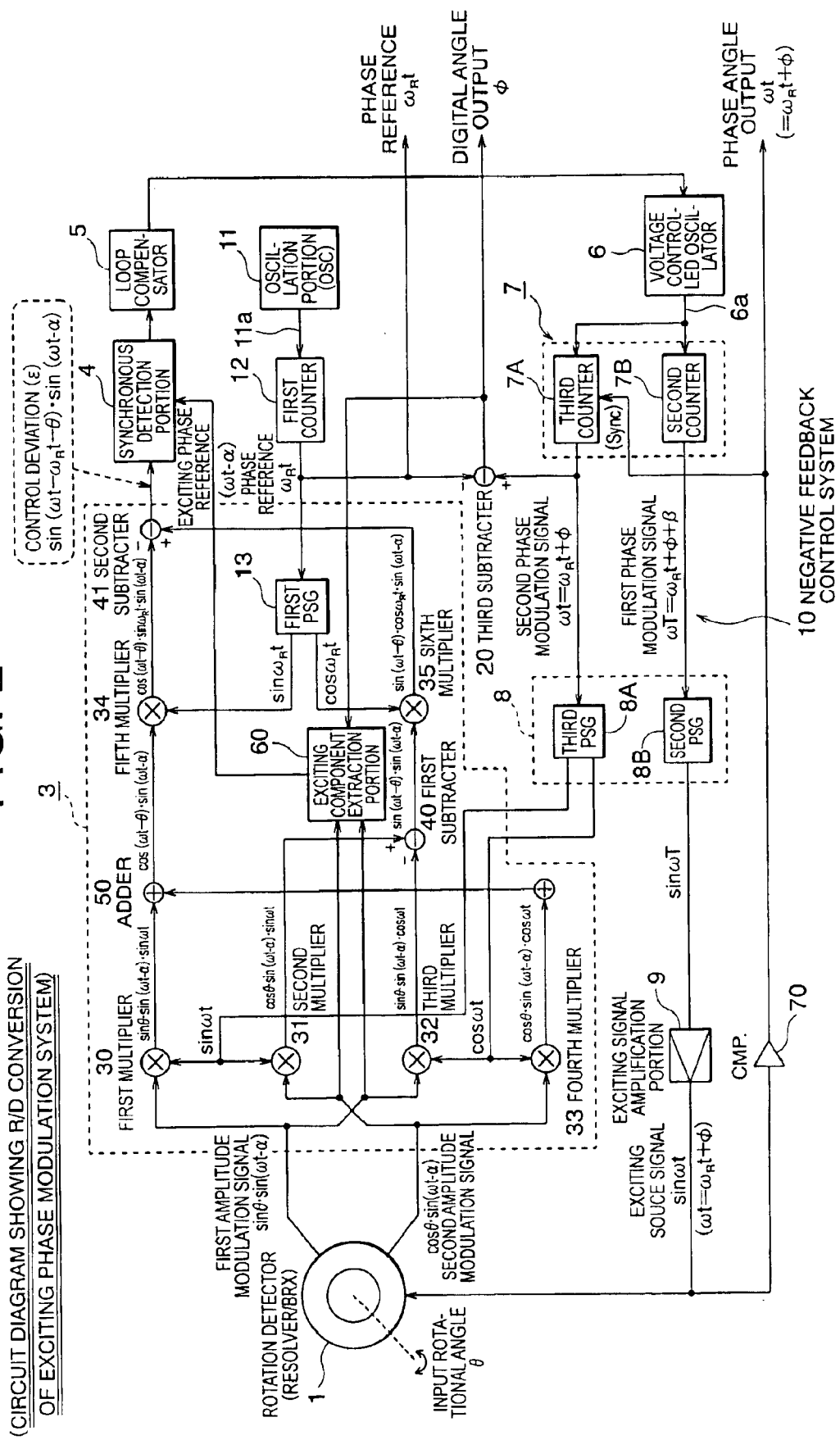

METHOD OF CONVERTING AN ANALOG SIGNAL INTO A DIGITAL SIGNAL

BACKGROUND OF THE INVENTION

1. Field of the Invention

The present invention relates in general to a method of converting an analog signal into a digital signal, and more particularly to a novel conversion method of obtaining a digital angle output using a negative feedback control system having a resolver within a closed loop to enhance conversion performance (such as resolution, accuracy, high speed follow-up property and noise resistance) to thereby make it possible to provide an inexpensive and high-performance resolver/digital (R/D) conversion unit integrated resolver used in fields of automobiles, robots, factory automation (FA) and household electric appliances).

2. Description of the Related Art

As for a method of converting into a digital signal a resolver output (analog signal) from a resolver of this sort which has been conventionally used, for example, it is possible to give a tracking method which is disclosed in JP 3,442,316 B and U.S. Pat. No. 6,278,388 and which is established as the related art.

Since the conventional method of converting an analog signal into a digital signal is constituted as described above, the following problems are encountered.

In the tracking method (see JP 3,442,316 B and U.S. Pat. No. 6,278,388) as the conventional conversion method, a closed loop is configured with first and second amplitude modulation signals outputted from a rotation detector (resolver) as a starting point. Hence, the rotation detector (resolver) itself is independent of a control system, and thus it is difficult to enhance the stability and the safety for the conversion operation, and the property of suppression of disturbances such as noises.

In addition, means for writing desired nonlinear data in a read only nonvolatile memory (ROM) in advance, and so forth is used in order to obtain the nonlinear characteristics of a SIN signal and a COS signal, and hence a chip area larger than that of other circuits is occupied also depending on a ROM capacity. Thus, a chip area cannot be made small when circuits are integrated with one another in the form of an IC, which leads to an increase in cost.

In addition, in the above-mentioned tracking method, it is difficult to maintain the high speed follow-up property unless the resolution is reduced.

Also, in addition to the above-mentioned tracking method, a method including extracting a digital angle signal Φ from phase information of an exciting component is conventionally known as a phase method. In this method, however, it is difficult to obtain a continuous output in real time with respect to a rotational angle input.

SUMMARY OF THE INVENTION

An object of the present invention is to provide an inexpensive and high-performance R/D conversion unit integrated resolver, in fields of automobiles, robots, factory automation (FA) and household appliances, which is capable of enhancing conversion performance (such as resolution, accuracy, high speed follow-up property and noise resistance) by obtaining a digital angle output using a negative feedback control system having a resolver within a closed loop.

To attain the above-mentioned object of the present invention, there is provided a method of converting an analog signal into a digital signal, the method including: inputting a two-phase sinusoidal signal consisting of two-phase amplitude modulation signals which are outputted from a resolver and amplitude-modulated with the two-phase amplitude modulation signals having respective exciting components to an R/D conversion portion; converting an input rotational angle ($\theta$) into a digital angle output ($\Phi$); and obtaining the digital angle output ($\Phi$) using a negative feedback control system including the resolver within a closed loop.

Further, according to the present invention, there is provided a method of converting an analog signal into a digital signal, further including: feeding back a phase modulation signal ($\omega_R t + \Phi$), as an exciting source signal ($\sin\omega t$) of the resolver, from the negative feedback control system of a phase locked loop (PLL) type using a control deviation ($\epsilon$) obtained through signal conversion of the two-phase sinusoidal signal using at least analog multiplication, and analog addition/subtraction in the R/D signal conversion portion.

Further, according to the present invention, there is provided a method of converting an analog signal into a digital signal, further including: configuring at least a synchronous detection portion to which the control deviation ($\epsilon$) from the R/D signal conversion portion is inputted, a loop compensator connected to the synchronous detection portion, a voltage controlled oscillator connected to the loop compensator, and a counter connected to the voltage controlled oscillator in the form of a digital circuit.

Further, according to the present invention, there is provided a method of converting an analog signal into a digital signal, further including: subtracting a phase reference ($\omega_R t$) set in advance from the phase modulation signal ($\omega_R t + \Phi$) to output rotational angle information contained as phase information of the phase modulation signal ($\omega_R t + \Phi$) as an absolute value digital angle output ($\Phi$) in real time.

Further, according to the present invention, there is provided a method of converting an analog signal into a digital signal, further including using pseudo sinusoid generators to convert the phase modulation signal ($\omega_R t + \Phi$) and the phase reference ($\omega_R t$) into analog signals.

Further, according to the present invention, there is provided a method of converting an analog signal into a digital signal, further including: automatically correcting phase shift of the phase modulation signal ($\omega_R t + \Phi$), and phase shift of the exciting components of the two-phase amplitude modulation signals ($\sin\theta \cdot \sin\omega t$, $\cos\theta \cdot \sin\omega t$).

Further, according to the present invention, there is provided a method of converting an analog signal into a digital signal, further including: obtaining a phase angle output ($\omega t$) from the exciting source signal ($\sin\omega t$).

Since the method of converting an analog signal into a digital signal according to the present invention is constituted as described above, the following effects can be obtained.

That is to say, this method has a conversion principle (concept) completely different from the tracking method established as the related art to create a control deviation of the PLL through the R/D signal conversion portion based on the analog signal processing, and the negative feedback control system (PLL) including the rotation detector (resolver) within the closed loop is configured to thereby obtain the digital angle output Φ. Hence, it is possible to obtain the enhancement of the conversion property (such as resolution, accuracy, high speed follow-up property and noise resistance), and thus it becomes possible to construct the resolver system (a resolver and a converter) requiring no phase adjustment.

In addition, input signal which has been originally amplitude-converted is rationally converted into the phase modulation signal through the analog signal conversion processing to obtain the control deviation of the PLL. Thus, the control frequency for the PLL can be limited to a fixed range, and hence the stable operation can be expected.

In addition, the large negative feedback control system (the PLL established as the stable negative feedback control system) including the rotation detector (resolver) as well is configured with the input rotation signal (θ) itself as a starting point. As a result, it is possible to enhance the stability and the safety for the conversion operation (negative feedback control) and the property of suppression of disturbances such as noises.

In addition, in the tracking method (see JP 3,442,316 B or U.S. Pat. No. 6,278,388) as a conventional conversion method, the means for writing desired nonlinear data in a read only nonvolatile memory (ROM) in advance, and so forth is used in order to obtain the nonlinear characteristics of a SIN signal and a COS signal, and hence a chip area larger than that of other circuits is occupied also depending on the ROM capacity. Thus, the chip area cannot be made small when the circuits are integrated with one another in the form of an IC, which leads to an increase in cost. However, the introduction of the analog signal processing makes the ROM unnecessary. Also, the introduction of the analog signal processing makes it possible to reduce the chip area when the circuits are integrated in the form of a monolithic IC. As a result, it becomes possible to realize highly reliable, miniature and inexpensive commercialization (mass production).

In addition, the amplitude information of the first and second amplitude modulation signals as the rotational angle information of the rotation detector (resolver) is replaced with the phase information continuously and in real time through the above-mentioned analog signal conversion, and the phase information is then introduced in the form of the control deviation to the PLL. Thereby, as in the tracking method (see JP 3,442,316 B and U.S. Pat. No. 6,278,388) as the conventional conversion method, even if the resolution is not reduced, the high speed follow-up becomes possible, and also it is possible to realize the continuous digital conversion.

In addition, the PLL is configured as means for extracting the rotational angle information included in the phase modulation signal as the phase information. Thus, the phase reference is subtracted from the phase modulation signal obtained as the parallel digital signal to thereby make it possible to obtain the parallel digital angle output (Φ) in real time.

In addition, the above-mentioned phase modulation signal is systematically divided into the first and second phase modulation signals. Then, the phase reference of the second phase modulation signal is synchronized with the phase of the resolver exciting source signal to correct the phase shift caused due to the provision of the exciting signal amplification portion or the like. Thereby, it becomes possible to realize the highly accurate digital conversion of the analog signal.

In addition, the synchronous detection is carried out based on the exciting phase reference obtained by extracting the exciting component of the resolver signal (the first and second amplitude modulation signals) itself, whereby it is possible to correct the phase shift of the resolver signal caused due to the provision of the rotation detector (resolver) or the like, and also it is possible to realize the highly accurate digital conversion of the analog signal.

Also, due to the system configuration having the redundancy permitting both the digital angle output (Φ) and the phase angle output ($\omega t(=\omega_R t+\Phi)$) to be had, it is possible to construct the angle detection system which is excellent in safety and reliability.

BRIEF DESCRIPTION OF THE DRAWINGS

In the accompanying drawings:

FIG. 1 is a block diagram showing a configuration of a method of converting an analog signal into a digital signal according to the present invention; and FIG. 2 is block diagram showing concretely the configuration shown in FIG. 1.

DESCRIPTION OF THE PREFERRED EMBODIMENT

A description will hereinafter be given to a preferred embodiment of a method of converting an analog signal into a digital signal according to the present invention with reference to the accompanying drawings.

FIG. 1 is a block diagram schematically showing an overall configuration of a method of converting an analog signal into a digital signal according to the present invention, and FIG. 2 is a block diagram showing a concrete configuration shown in FIG. 1.

Referring to FIG. 1, reference numeral 1 designates a resolver as a rotation detector for detecting an input rotational angle θ. First and second amplitude modulation signals sinθ·sinωt and cosθ·sinωt (namely, which are obtained through the amplitude modulation with an exciting source signal sinωt as an exciting component) as a two-phase sinusoidal signal 2 obtained from the resolver 1 are both inputted to an R/D signal conversion portion 3 for carrying out resolver/digital (R/D) conversion. A control deviation (ε) $\sin(\omega t-\omega_R t-\theta)\cdot\sin\omega t$ from the R/D signal conversion portion 3 is then inputted to a synchronous detection portion 4. A detection output 4a from the synchronous detection portion 4 is inputted to a voltage controlled oscillator (VCO) 6 after a value or the like of the detection output 4a required to configure a closed loop is compensated in a loop compensator 5.

After an output 6a from the voltage controlled oscillator 6 is counted in a counter 7, an output from the counter 7 is inputted as a phase modulation signal ($\omega_R t+\Phi$) to an exciting signal generator 8. Both cosωt and sinωt from the exciting signal generator 8 are inputted to the R/D signal conversion portion 3. After sinωt is amplified in an exciting signal amplification portion 9, the resultant signal is inputted as an exciting source signal sinωt acting as an exciting component (carrier) to an exciting wiring (not shown) of the resolver 1.

Consequently, at least the resolver 1, the R/D signal conversion portion 3, the synchronous detection portion 4, the loop compensator 5, the voltage controlled oscillator 6, the counter 7, the exciting signal generator 8, and the exciting signal amplification portion 9 constitute a negative feedback control system 10 of a closed loop type.

After an oscillation output 11a from an oscillator 11 which is provided independently of the negative feedback control system 10 for generating a clock signal is counted in a first counter 12, the oscillation output 11a is inputted as a phase reference $\omega_R t$ to a pseudo sinusoid generator 13. Pseudo sinusoids $\sin\omega_R t$ and $\cos\omega_R t$ from the pseudo sinusoid generator 13 are then inputted to the R/D signal conversion portion 3.

In addition, the phase reference $\omega_R t$ is inputted to a third subtracter 20 to which the phase modulation signal ($\omega_R t+\Phi$)

is also inputted to subtract the phase reference $\omega_R t$ from the phase modulation signal $(\omega_R t+\Phi)$ to thereby obtain a digital angle output $\Phi$.

The circuit shown in the form of the block diagram in FIG. 1 is concretely configured as shown in FIG. 2. Thus, the R/D signal conversion portion 3 includes first the sixth multipliers 30 to 35, first and second subtracters 40 and 41, an adder 50, a first pseudo sinusoid generator 13 and an exciting component extraction portion 60. Note that the pseudo sinusoid generator is also referred to as a PSG for short.

The counter 7 includes third and second counters 7A and 7B, and the exciting signal generator 8 includes third and second pseudo sinusoid generators 8A and 8B.

The phase modulation signal $(\omega_R t+\Phi)$ consists of second and first phase modulation signals $(\omega t=\omega_R t+\Phi)$ and $(\omega T=\omega_R t+\Phi+\beta)$ from the second and first counters 7A and 7B, respectively. The second and first phase modulation signals $(\omega t=\omega_R t+\Phi)$ and $(\omega T=\omega_R t+\Phi+\beta)$ are inputted to the third and second pseudo sinusoid generators 8A and 8B, respectively. Both $\sin\omega t$ and $\cos\omega t$ are inputted from the third pseudo sinusoid generator 8A to the R/D signal converter 3.

The exciting source signal $\sin\omega t$ is inputted to a comparator 70 in order to obtain a phase angle output $(\omega t(=\omega_R t+\Phi))$ as a digital signal. The resultant phase angle output $\omega t$ is also inputted to the third counter 7A.

A digital angle output $\Phi$ is outputted from the third subtracter 20 concurrently with the phase angle output $\omega t$. Thus, the redundancy system is configured.

The resolver 1 adapted to the rotation detector in the present invention is an amplitude modulation system brushless resolver (BRX) of a one-phase excitation/two-phase output type. Thus, the exciting source signal $(\sin\omega t)$ which has essentially a fixed frequency is inputted as a carrier to the resolver 1 which outputs two outputs of a first amplitude modulation signal $(\sin\theta\cdot\sin(\omega t-\alpha))$ and a second amplitude modulation signal $(\cos\theta\cdot\sin(\omega t-\alpha))$ which are obtained through the amplitude modulation corresponding to a mechanical input rotational angle $\theta$. In the first and second amplitude modulation signals, reference symbol $\alpha$ represents the phase shift (phase delay) caused due to the provision of the rotation detector (resolver) itself, the sensor cable and the like. However, in the present invention, the phase (frequency) of the exciting source signal $(\sin\omega t)$ is not fixed, and hence changes in correspondence to the rotational angle (speed) of the rotation detector (resolver).

The present invention relates to a method of converting an analog signal into a digital signal, including: introducing the first amplitude modulation signal $(\sin\theta\cdot\sin(\omega t-\alpha))$ and the second amplitude modulation signal $(\cos\theta\cdot\sin(\omega t-\alpha))$ into the R/D signal conversion portion 3; configuring the phase locked loop (PLL) as the negative feedback system 10 including the rotation detector (resolver) within the closed loop based on the resultant control deviation $(\epsilon)$; converting the amplitude information of the rotational angle (speed) into the phase (frequency) information; allowing the digital angle output $\Phi$ to be obtained from the phase modulation signal $(\omega_R t+\Phi)$ which is generated through the process for feeding back the resultant phase (frequency) information as the exciting source signal $(\sin\omega t)$.

Next, an operation will hereinafter be described.

First of all, the first amplitude modulation signal $(\sin\theta\cdot\sin(\omega t-\alpha))$ and the second amplitude modulation signal $(\cos\theta\cdot\sin(\omega t-\alpha))$ as outputs of the rotation detector (resolver) 1 are inputted to the first to fourth multipliers 30 to 33, respectively.

The first multiplier 30 multiplies the first amplitude modulation signal $(\sin\theta\cdot\sin(\omega t-\alpha))$ by the third PSG signal $(\sin\omega t)$ from the third pseudo sinusoid generator 8A to carry out an analog arithmetic operation expressed by Equation (1):

$$\sin\theta\cdot\sin(\omega t-\alpha)\times\sin\omega t=\sin\theta\cdot\sin(\omega t-\alpha)\cdot\sin\omega t \quad (1)$$

Similarly, the second multiplier 31 multiplies the second amplitude modulation signal $(\cos\theta\cdot\sin(\omega t-\alpha))$ by the third PSG signal $(\sin\omega t)$ to carry out an analog arithmetic operation expressed by Equation (2):

$$\cos\theta\cdot\sin(\omega t-\alpha)\times\sin\omega t=\cos\theta\cdot\sin(\omega t-\alpha)\cdot\sin\omega t \quad (2)$$

Similarly, the third multiplier 32 multiplies the first amplitude modulation signal $(\sin\theta\cdot\sin(\omega t-\alpha))$ by the third PSG signal $(\cos\omega t)$ to carry out an analog arithmetic operation expressed by Equation (3):

$$\sin\theta\cdot\sin(\omega t-\alpha)\times\cos\omega t=\sin\theta\cdot\sin(\omega t-\alpha)\cdot\cos\omega t \quad (3)$$

Also, Similarly, the fourth multiplier 33 multiplies the second amplitude modulation signal $(\cos\theta\cdot\sin(\omega t-\alpha))$ by the third PSG signal $(\cos\omega t)$ to carry out an analog arithmetic operation expressed by Equation (4):

$$\cos\theta\cdot\sin(\omega t-\alpha)\times\cos\omega t=\cos\theta\cdot\sin(\omega t-\alpha)\cdot\cos\omega t \quad (4)$$

The adder 50 adds output of the first multiplier 30 expressed by Equation (1) to the output of the fourth multiplier 33 expressed by Equation (4) to carry out an analog arithmetic operation expressed by Equation (5):

Equation (1)+Equation (4)=$\sin\theta\cdot\sin(\omega t-\alpha)\cdot\sin\omega t+\cos\theta\cdot\sin(\omega t-\alpha)\cdot\cos\omega t=\cos(\omega t-\theta)\cdot\sin(\omega t-\alpha)$ (5)

Also, the first subtracter 40 subtracts the output of the third multiplier 32 expressed by Equation (3) from the output of the second multiplier 31 expressed by Equation (2) to carry out an analog arithmetic operation expressed by Equation (6):

Equation (2)−Equation (3)=$\cos\theta\cdot\sin(\omega t-\alpha)\cdot\sin\omega t-\sin\theta\cdot\sin(\omega t-\alpha)\cdot\cos\omega t=\sin(\omega t-\theta)\cdot\sin(\omega t-\alpha)$ (6)

Moreover, the fifth multiplier 34 multiplies the output of the adder 50 expressed by Equation (5) by the first PSG signal $(\sin\omega_R t)$ from the first pseudo sinusoid generator 13 to carry out an analog arithmetic operation expressed by Equation (7):

$$\cos(\omega t-\theta)\cdot\sin(\omega t-\alpha)\times\sin\omega_R t=\cos(\omega t\theta)\cdot\sin\omega_R t\cdot\sin(\omega t-\alpha) \quad (7)$$

Similarly, the sixth multiplier 35 multiplies the output of the first subtracter 40 expressed by Equation (6) by the first PSG signal $(\cos\omega_R t)$ from the first pseudo sinusoid generator 13 to carry out an analog arithmetic operation expressed by Equation (8):

$$\sin(\omega t-\theta)\cdot\sin(\omega t-\alpha)\times\cos\omega_R t=\sin(\omega t-\theta)\cdot\cos\omega_R t\cdot\sin(\omega t-\alpha) \quad (8)$$

Here, the second subtracter 41 subtracts the output of the fifth multiplier 34 expressed by Equation (7) from the output of the sixth multiplier 35 expressed by Equation (8) to carry out an analog arithmetic operation expressed by Equation (9):

Equation (8)−Equation (7)=$\sin(\omega t-\theta)\cdot\cos\omega_R t\cdot\sin(\omega t-\alpha)-\cos(\omega t-\theta)\cdot\sin\omega_R t\cdot\sin(\omega t-\alpha)=\sin(\omega t-\omega_R t-\theta)\cdot\sin(\omega t-\alpha)$ (9)

The first amplitude modulation signal $(\sin\theta\cdot\sin(\omega t-\alpha))$ and the second amplitude modulation signal $(\cos\theta\cdot\sin(\omega t-$ α)) as outputs of the rotation detector (resolver) 1 are converted into a control deviation (ε) of the R/D conversion control system (PLL) expressed by Equation (9) through the processes for processing the analog signal expressed by Equations (1) to (9).

In the method of converting an analog signal into a digital signal according to the present invention, as well known, the control is carried out such that the control deviation (ε) becomes zero at all times.

The control deviation (ε) $\sin(\omega t-\omega_R t-\theta)\cdot\sin\omega t$ expressed by Equation (9) is introduced into the synchronous detector portion 4 so that $\sin(\omega t-\alpha)$ as the exciting component is expressed in the form of an absolute value as expressed by Equation (10):

[Equation 1]

$$\varepsilon=\sin(\omega t-\omega_R t-\theta)\cdot|\sin(\omega t-\alpha)| \quad (10)$$

One exciting phase reference ($\omega t=\alpha$) inputted from the exciting component extraction portion 60 to the synchronous detection portion 4 is obtained by extracting only the exciting components from the first amplitude modulation signal ($\sin\theta\cdot\sin(\omega t-\alpha)$) and the second amplitude modulation signal ($\cos\theta\cdot\sin(\omega t-\alpha)$) in the exciting component extraction portion 60, respectively. Thus, it is possible to avoid the phase shift (synchronous shift) in the synchronous detection portion 4. Consequently, this process contributes the highly accurate digital conversion (R/D conversion) for an analog signal. Note that the control deviation (ε) expressed by Equation (10) is introduced into the loop compensation 5 in the next stage, and hence can be equivalently regarded as a signal expressed by Equation (11):

$$\varepsilon=\sin(\omega t-\omega_R t-\theta) \quad (11)$$

Here, as described above, the negative feedback control system 10 (PLL) of the R/D converter according to the present invention is controlled such that the control deviation (ε) becomes zero at all times. Hence, the control deviation (ε) can be expressed by Equation (12):

[Equation 2]

$$\varepsilon=\sin(\omega t-\omega_R t-\theta)=0 \therefore \omega t=\omega_R t+\theta \quad (12)$$

Next, the control deviation (ε) expressed by Equation (11) is converted into a digital pulse train corresponding to an input voltage in the voltage controlled oscillator (VCO) 6 to be introduced into the second and third converters 7B and 7A in the next stage, respectively. The second and third counters 7B and 7A integrate the digital pulse trains inputted thereto to convert the their resultant signals into parallel signals which become a first modulation signal ($\omega T=\omega_R t+\Phi+\beta$) and a second modulation signal ($\omega t=\omega_R t+\Phi$), respectively. Here, in those output signals, $\Phi$ is a digital angle output which is finally obtained, and β corresponds to the phase shift which is caused in the exciting signal amplification portion 9 or the like.

Next, the first modulation signal ($\omega T=\omega_R t+\Phi+\beta$) is a parallel digital signal. Then, after the first modulation signal ($\omega T=\omega_R t+\Phi+\beta$) is converted into an analog sinusoidal signal through the second pseudo sinusoid generator 8B, the resultant analog sinusoidal signal is introduced into the exciting signal amplification portion 9 to serve as the exciting source signal ($\sin\omega t$) to excite the rotation detector (resolver) 1. As a result, the negative feedback control system 10 is configured including the large negative feedback control loop (PLL) having the rotation detector (resolver) 1. Note that a simple voltage amplifier may be adopted for the exciting signal amplification portion 9. However, a current controlled amplifier which is highly effective in compensation for the temperature characteristics of the rotation detector (resolver) 1 is effective to be adopted for the exciting signal amplification portion 9. However, since the rotation detector (resolver) 1 is basically an inductive (L) load, it is difficult to avoid the phase shift between the input and the output. Thus, how to absorb the phase shift (β) including the second pseudo sinusoid generator 8B is one important key to the enhancement of the accuracy in terms of the R/D conversion.

In addition, the exciting source signal ($\sin\omega t$) excites the rotation detector (resolver) 1, while the exciting source signal ($\sin\omega t$) is introduced into the comparator 70 to be digitized, and the resultant signal is then outputted in the form of the phase angle output ($\omega t(=\omega_R t+\Phi)$). Also, the exciting source signal ($\sin\omega t$) is utilized for synchronization of the third counter 7A. As a result, the phase shift (β) which the first phase modulation signal ($\omega t=\omega_R t+\Phi+\beta$) has can be eliminated with the second phase modulation signal ($\omega t=\omega_R t+\Phi$) which is the output of the third counter 7A. Thus, the phase reference ($\omega_R t$) is subtracted from the second phase modulation signal ($\omega t=\omega_R t+\Phi$) in the third subtracter 20 to thereby make it possible to obtain the accurate digital angle output ($\Phi$).

On the other hand, the second phase modulation signal ($\omega t=\omega_R t+\Phi$) is introduced into the third pseudo sinusoid generator 8A to be fed back as the third PSG signal ($\sin\omega t$) and the third PSG signal ($\cos\omega t$) to the first and second multipliers 30 and 31, and the third and fourth multipliers 32 and 33, respectively.

The operation for converting an analog signal into a digital signal (R/D conversion) according to the present invention is sequentially carried out in accordance with a reference clock signal generated from an oscillator 11. The reference clock signal is provided as a synchronous clock signal to each of the digital signal processing portions, while the reference clock signal is parallel-converted in the first counter 12 to be provided as a phase reference ($\omega_R t$) which linearly increases with a lapse of time. The phase reference ($\omega_R t$) is outputted in the form of a timing reference for the phase angle output ($\omega t(=\omega_R t+\Phi)$), while the phase reference ($\omega_R t$) is introduced into the first pseudo sinusoid generator 13 to be fed back as the first PSG signal ($\sin\omega_R t$) and the first PSG signal ($\cos\omega_R t$) to the fifth and sixth multipliers 34 and 35, respectively.

Consequently, the exciting source signal $\sin\omega t$ contains the detection angle information in its phase component. Thus, the detection angle information is extracted in the outside, making it possible to obtain the output equivalent to the digital angle output ($\Phi$) which is directly obtained according to the present invention, and to ensure the redundancy for the angle output.

In addition, as the exciting source signal $\sin\omega t$ contains the detection angle information in its phase component as described above, the rotational speed of the rotation detector (resolver) 1 can be obtained in the form of a phase change (frequency) of the exciting source signal.

For this reason, when a maximum rotational speed of the rotation detector (resolver) 1 is ±60,000 rpm for example, the control frequency of the negative feedback control system (PLL) including the rotation detector (resolver) 1 corresponds to a frequency change of ±1,000 Hz. Thus, when the frequency of the exciting source signal is 10 kHz, the frequency change of ±10% has to be controlled, which is favorable for the closed loop control.

Moreover, the above-mentioned operation is summarized as follows.

The method of converting an analog signal into a digital signal according to the present invention includes: inputting the two-phase sinusoidal signal consisting of two-phase amplitude modulation signals (sinθ·sinωt, cosθ·sinωt) which are outputted from the resolver 1 and amplitude-modulated with the two-phase amplitude modulation signal having respective exciting components to the R/D conversion portion; converting the input rotational angle (θ) into the digital angle output (Φ); and obtaining the digital angle output (Φ) using the negative feedback control system 10 including the resolver 1 within the closed loop.

The method of the present invention further includes: feeding back the phase modulation signal ($\omega_R t + \Phi$), as the exciting source signal (sinωt) of the resolver 1, from the negative feedback control system 10 of the phase locked loop (PLL) type using a control deviation (ε) obtained through the signal conversion of the two-phase sinusoidal signal 2 using at least the analog multiplication and the analog addition and the subtraction in the R/D signal conversion portion 3.

The method of the present invention further includes: configuring at least the synchronous detection portion 4 to which the control deviation (ε) from the R/D signal conversion portion 3 is inputted, the loop compensator 5 connected to the synchronous detection portion 4, the voltage controlled oscillator 6 connected to the loop compensator 5, and the counter 7 connected to the voltage controlled oscillator 6 in the form of the digital circuit to use the digital circuit.

The method of the present invention further includes: subtracting the phase reference ($\omega_R t$) set in advance from the phase modulation signal ($\omega_R t + \Phi$) to output rotational angle information contained as phase information of the phase modulation signal ($\omega_R t + \Phi$) as an absolute value digital angle output (Φ) in real time.

The method of the present invention further includes: automatically correcting the phase shift of the phase modulation signal ($\omega_R t + \Phi$), and the phase shift of the exciting components of the two-phase amplitude modulation signals (sinθ·sinωt, cosθ·sinωt) using the pseudo sinusoid generators 13, 8A and 8B in order to convert the phase modulation signal ($\omega_R t + \Phi$) and the phase reference ($\omega_R t$) into analog signals.

It should be noted that while not illustrated in the figures, it is possible to adopt such a configuration that the resolver 1, the R/D signal conversion portion 3 or the like is provided with a circuit, a function or the like for detecting various kinds of abnormalities, or includes a self-diagnosis function to constantly detect whether or not an operation is a normal operation.

The present invention can be applied not only to the resolver but also to a synchronous apparatus or the like.

What is claimed is:

1. A method of converting an analog signal into a digital signal, the method comprising:
   inputting a two-phase sinusoidal signal consisting of two-phase amplitude modulation signals (sinθ·sinωt, cosθ·sinωt) which are outputted from a resolver and amplitude-modulated with the two-phase amplitude modulation signals having respective exciting components to an R/D conversion portion;
   converting an input rotational angle (θ) into a digital angle output (Φ); and
   obtaining the digital angle output (Φ) using a negative feedback control system including the resolver within a closed loop.

2. A method of converting an analog signal into a digital signal according to claim 1, further comprising:
   feeding back a phase modulation signal ($\omega_R t + \Phi$), as an exciting source (sinωt) of the resolver, from the negative feedback control system of a phase locked loop (PLL) type using a control deviation (ε) obtained through signal conversion of the two-phase sinusoidal signal using at least analog multiplication and analog addition/subtraction in the R/D signal conversion portion.

3. A method of converting an analog signal into a digital signal according to claim 1, further comprising:
   configuring at least a synchronous detection portion (4), to which the control deviation (ε) from the R/D signal conversion portion is inputted, a loop compensator connected to the synchronous detection portion, a voltage controlled oscillator connected to the loop compensator, and a counter connected to the voltage controlled oscillator in the form of a digital circuit.

4. A method of converting an analog signal into a digital signal according to claim 2, further comprising:
   subtracting a phase reference ($\omega_R t$) set in advance from the phase modulation signal ($\omega_R t + \Phi$) to output rotational angle information contained as phase information of the phase modulation signal ($\omega_R t + \Phi$) as an absolute value digital angle output (Φ) in real time.

5. A method of converting an analog signal into a digital signal according to claim 4, further comprising:
   using pseudo sinusoid generators (13, 8A, 8B) to convert the phase modulation signal ($\omega_R t + \Phi$) and the phase reference ($\omega_R t$) into analog signals.

6. A method of converting an analog signal into a digital signal according to claim 2, further comprising:
   automatically correcting phase shift of the phase modulation signal ($\omega_R t + \Phi$) and phase shift of the exciting components of the two-phase amplitude modulation signals (sinθ·sinωt, cosθ·sinωt).

7. A method of converting an analog signal into a digital signal according to claim 1, further comprising:
   obtaining a phase angle output (ωt) from the exciting source signal (sinωt).

8. A method of converting an analog signal into a digital signal according to claim 2, further comprising:
   configuring at least a synchronous detection portion (4), to which the control deviation (ε) from the R/D signal conversion portion is inputted, a loop compensator connected to the synchronous detection portion, a voltage controlled oscillator connected to the loop compensator, and a counter connected to the voltage controlled oscillator in the form of a digital circuit.

9. A method of converting an analog signal into a digital signal according to claim 3, further comprising:
   subtracting a phase reference ($\omega_R t$) set in advance from the phase modulation signal ($\omega_R t$ Φ) to output rotational angle information contained as phase information of the phase modulation signal ($\omega_R t + \Phi$) as an absolute value digital angle output (Φ) in real time.

10. A method of converting an analog signal into a digital signal according to claim 3, further comprising:
    automatically correcting phase shift of the phase modulation signal ($\omega_R t + \Phi$) and phase shift of the exciting components of the two-phase amplitude modulation signals (sinθ·sinωt, cosθ·sinωt).

11. A method of converting an analog signal into a digital signal according to claim 4, further comprising:
    automatically correcting phase shift of the phase modulation signal ($\omega_R t + \Phi$) and phase shift of the exciting components of the two-phase amplitude modulation signals (sinθ·sinωt, cosθ·sinωt).

12. A method of converting an analog signal into a digital signal according to claim 5, further comprising:

automatically correcting phase shift of the phase modulation signal ($\omega_R t+\Phi$) and phase shift of the exciting components of the two-phase amplitude modulation signals ($\sin\theta\cdot\sin\omega t$, $\cos\theta\cdot\sin\omega t$).

13. A method of converting an analog signal into a digital signal according to claim 2, further comprising:

obtaining a phase angle output ($\omega t$) from the exciting source signal ($\sin\omega t$).

14. A method of converting an analog signal into a digital signal according to claim 3, further comprising:

obtaining a phase angle output ($\omega t$) from the exciting source signal ($\sin\omega t$).

15. A method of converting an analog signal into a digital signal according to claim 4, further comprising:

obtaining a phase angle output ($\omega t$) from the exciting source signal ($\sin\omega t$).

16. A method of converting an analog signal into a digital signal according to claim 5, further comprising:

obtaining a phase angle output ($\omega t$) from the exciting source signal ($\sin\omega t$).

17. A method of converting an analog signal into a digital signal according to claim 6, further comprising:

obtaining a phase angle output ($\omega t$) from the exciting source signal ($\sin\omega t$).

* * * * *